United States Patent
Ho et al.

(10) Patent No.: US 6,545,350 B2
(45) Date of Patent: Apr. 8, 2003

(54) INTEGRATED CIRCUIT PACKAGES AND THE METHOD FOR THE SAME

(75) Inventors: Kai-Kuang Ho, Hsin-Chu (TW); Te-Sheng Yang, Taiipei (TW); Charlie Han, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/774,789

(22) Filed: Jan. 31, 2001

(65) Prior Publication Data

US 2002/0102833 A1 Aug. 1, 2002

(51) Int. Cl.[7] .......................... H01L 23/10; H01L 23/34
(52) U.S. Cl. ........................................ 257/706; 257/666
(58) Field of Search ........................... 257/666, 675, 257/678, 693, 694, 706, 734, 796

(56) References Cited

U.S. PATENT DOCUMENTS 5,172,213 A * 12/1992 Zimmerman ................ 257/796
5,629,561 A * 5/1997 Shin et al. ................... 257/712
5,825,623 A * 10/1998 Lee et al. .................... 361/707

* cited by examiner

Primary Examiner—David Nelms
Assistant Examiner—David Nhu

(57) ABSTRACT

This invention relates to a method and a means for packaging integrated circuits, especially relates to a heat sink in the operating integrated circuit packages. The heat sink is bonded on the lead frame by a tap and take advantage of the length between the heat sink and the first mold packaged materials at the first axis to be about equal to the length between the chip and the second mold packaged materials at the first axis to prevent producing voids form unbalanceable thermal mold flow. The heat sink can also dissipating heat from the lead frame to others spaces in the integrated circuit packages. This method and means can prevent delaminating and cracking occurring in the chip and increasing the qualities in integrated circuits.

8 Claims, 8 Drawing Sheets

INTEGRATED CIRCUIT PACKAGES AND THE METHOD FOR THE SAME

BACKGROUND OF THE INVENTION

1. Field of the Invention

The present invention relates in general to a skill of integrated circuit (IC) packages and, more particularly, to structural improvement method and means in such integrated circuit packages for preventing voids (air traps) being generated from the unbalance mold flow and effectively dissipating heat from the leads within the integrated circuit packages.

2. Description of the Prior Art

Integrated circuits are typically housed within a plastic package commonly referred to as a quad flat pack (QFP). Flat packs contain a lead frame, which has a plurality leads that are connected to an integrated circuit die. The die is encapsulated by a hard plastic housing, which mechanically supports and electrically insulates the integrated circuit. The leads are typically soldered to a printed circuit board.

Packaging techniques for integrated circuits have been developed in the past in an attempt to satisfy demands for miniaturization in the integrated circuit industry. Improved methods for miniaturization of integrated circuits enabling the integration of millions of transistor circuit elements into single integrated silicon embodied circuits, or chips, have resulted in increased emphasis on methods to package these circuits in space efficient.

Integrated circuits are created from a silicon wafer using various etching, doping, depositing and cutting steps that are well know in the art of fabricating integrated circuit devices. A silicon wafer may be comprised of a number of integrated circuit dies that each represents a single integrated circuit chip. Ultimately, the chip may be packaged by transfer molding plastic encasement around the chip with a variety of pin-out or mounting and interconnection schemes. For example, M-Dip (Dual-In-Line-Plastic) provides a relatively flat, molded package having dual parallel rows of leads extending from the bottom for through-hole connection and mounting to an underlying printed circuit board. More compact integrated circuits allowing greater density on a printed circuit board are the SIP (Single-In-Line-Plastic), and SOJ (Small Outline J-leaded) molded case packages.

Typically, an array of electrical conductors called a "lead frame" is used as an interface between the integrated circuit and external circuitry for facilitating interconnection. In the case of the lead-on-chip package, the lead frame is designed to align with and connect to the integrated circuit connection pads located on a face of the integrated circuit chip. These connection pads are the points at which all input and output signals, and power and ground connections are made for the integrated circuit to function as designed.

In the case of the lead-on-chip variety of integrated circuit package, the conductors of the lead frame may be any metal suitable for bonding and may be plated, either selectively or non-selectively, as is well known in the art. Each type of integrated circuit requires a lead frame with a specific pattern of wires. This pattern may be fabricated using etching or stamping principles well known in the art of printed circuits. In addition to having the correct pattern for a specific integrated circuit, the lead frame must be properly aligned and held in alignment with the integrated circuit connection pads. Once aligned the lead frame may be connected to the integrated circuit connection pads by wire bonding, tape automated bonding ("TAB"), wedge bonding or other methods well known in the art.

The lead frame is held in alignment with the integrated circuit connection pads by fixedly attaching it to the integrated circuit face having the connection pads thereon. The integrated circuit face must be insulated from the lead frame because the transistors and silicon substrate that comprise the integrated circuit are exposed and would short out if the conductive lead frame came into contact with the transistors or substrate. Therefore, insulation of some type is required between the integrated circuit face having the connection pads and the lead frame.

A three-layer sandwich consisting of a polyimide film carrier, such as Kapton (R), with adhesive on both sides has been used as a means for attaching the lead frame to the integrated circuit. Polyimide absorbs moisture which degrades the reliability of an integrated circuit package. The polyimide carrier may be as thin as 1 mil with adhesive of 0.5 mils on both sides making this sandwich a total thickness of 2 mils. Sandwich material thinner than 2 mils is difficult or impossible to handle as a single piece part during fabrication of the integrated circuit. Thus, the overall thickness of an integrated circuit package is affected by the 2 mil or greater thickness of the insulation and adhesive presently used during fabrication. Heat generated by the integrated circuit circuits must flow by thermal conduction through the 2 mil (three layer) dielectric polymer sandwich into the lead frame where the heat may be dissipated into the encapsulating package and/or into external heat conductive circuits.

Referring to FIG. 1, it is a drawing of traditional packaged integrated circuit within lead-on chip structure of the integrated circuit package. In order to conduct the thermal energy from the lead frame 60 and make the thermal energy flowing uniformly in the package successfully to achieve an object of balancing thermal mold flow, the ratio of the first mold stature $H_1$ to the second mold stature $H_2$ is 3:1 in the package. In this lead-on chip package, lead frame 60 is located on the parting line between the first mold 10 and the second mold 20. The part space of the first mold is occupied by chip 30 which is in the first mold 10, and therefore the space in the first mold 10 is bigger than the space in the second mold 20 to make balanceable thermal mold flow in the package.

In order to proceed the thermal mold flow circle in the lead-on chip structural package, the length $H_3$ between the lead frame 60 and the second mold 20 packaged material at the second axis is designed to be equal to the length $H_4$ between the chip 30 and the first mold 10 packaged material at the second axis to avoid the process problem in the thermal mold flow in the lead-on chip structure packages. In the lead-on chip structure package, the lead frame 60 is located on the parting line between the first mold 10 and the second mold 20. There is not any means in the second mold 20 to occupy the space of the second mold 20, but there is a chip in the first mold 10 to occupy the part space of the first mold 10. In order to make the length $H_3$ between the lead frame 60 and the second mold 20 packaged material at the second axis to be equal to the length $H_4$ between the chip 30 and the first mold 10 packaged material at the second axis, and therefore the space of the first mold must to be broadened to follow the thickness of the chip. So that the ratio of the thickness of the first mold $H_1$ to the thickness of the second mold $H_2$ is 3:1 in the traditional package structure. If the thickness of the first mold and the thickness of the second mold are the same, the thermal mold flow circle will produce problem in the packages.

When we want to reduce the volume of the integrated circuit to reduce the length between the chip and the first mold packaged material, the ratio of the length between the lead frame and the second mold packaged material to the length between the chip and the first mold packaged material can not keep 1:1. The thermal mold flow circle produce some voids to make the chip delaminating and cracking in the using packages to reduce the quality of the integrated circuits.

SUMMARY OF THE INVENTION

In accordance with the present invention, a main object of this method is to prevent producing the voids by increased heat sink to balance the mold flow in the first mold and the second mold.

The second object of this invention is to prevent cracking on the chip by increased heat sink to solve the problem in producing the voids as a result of the unbalanceable mold flow in the first mold and the second mold.

The third object of this invention is to prevent the damage in the integrated circuit by increased heat sink to speed up the rate of dissipating thermal from the leads.

The fourth object of this invention is to increase the density of the integrated circuit packages by increased heat sink to solve the problem in producing the voids as a result of the unbalanceable mold flow in the first mold and the second mold and the problem in thermal dissipating.

The fifth object of this invention is to reduce the volume of the packaged integrated circuit successfully by increased heat sink to solve the problem in the unbalanceable mold flow in the first mold and the second mold and the problem in thermal dissipating.

It is a further object of this invention to increase the quality of the products and reduce the loss for bad products by increased heat sink to solve the problem in producing the voids as a result of the unbalanceable mold flow in the first mold and the second mold and the problem in thermal dissipating.

In according to the foregoing objects, The present invention provides the thermal dissipating means which is on the first surface of the lead frame at the second axis is the heat sink to make the length between the chip and the first mold packaged materials at the second axis to be equal to the length between the heat sink and the second mold packaged materials at the second axis. When both of the lengths are equaled, the thermal mold flow will be balanced in the first mold and the second mold to avoid producing voids which will result a part of environment in high temperature and high humidity in the integrated circuits to make delaminating and cracking on the chip, increasing the thermal dissipating rate of the lead frame, increasing the circle of using the integrated circuit and reducing the bad rate of the quality in the integrated circuits.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 2:
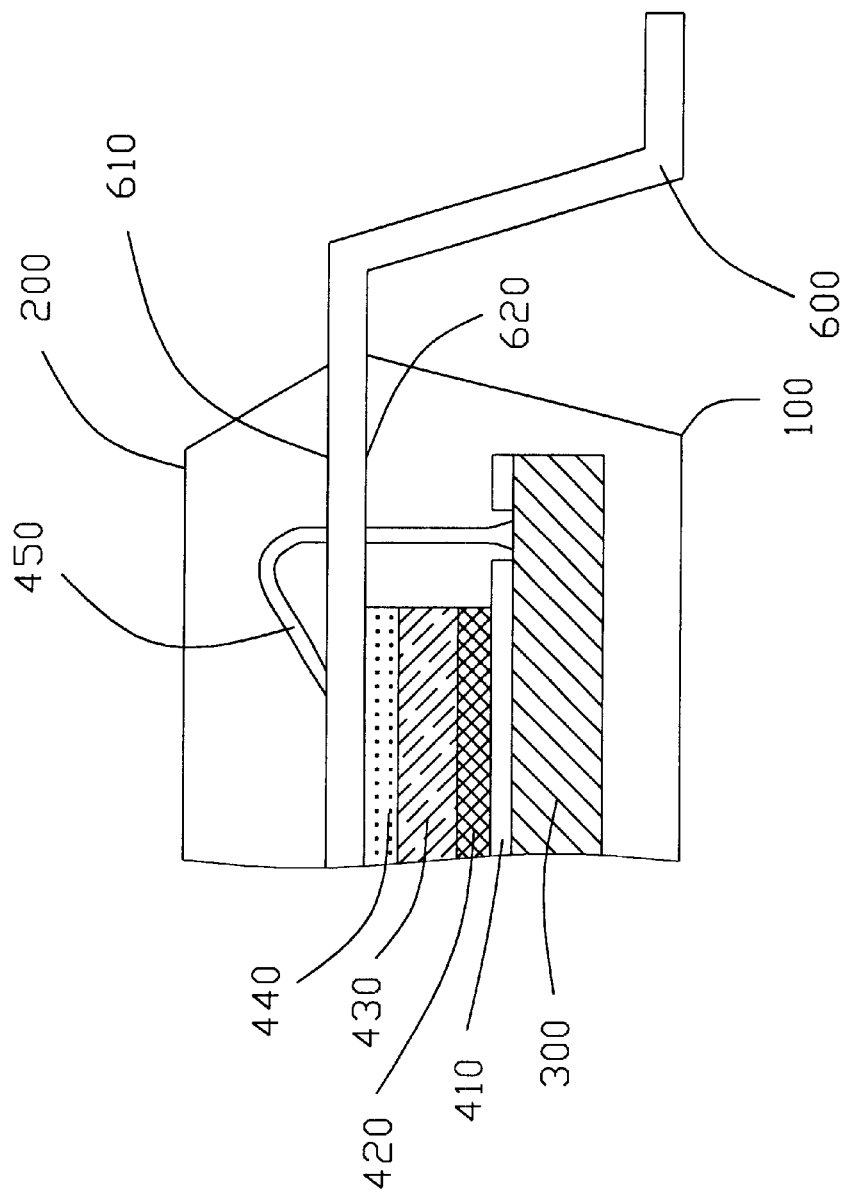
FIG. 2 is a sectional diagram showing the lead-on chip packaged integrated circuits.

The foregoing aspects and many of the attendant advantages of this invention will become more readily appreciated as the same becomes better understood by reference to the following detailed description, when taken in conjunction with the accompanying drawings, wherein:

Referring to FIG. 2, it is a sectional diagram showing the lead-on chip packaged integrated circuit. The chip 300 is bonded on the second surface of the lead frame 600 by an adhesive layer. The adhesive layer which is comprising: a chip protecting coating layer 410, a binder layer 420, a macromolecular film 430 and a binder layer 440 make the chip 300 on the second surface of the lead frame 600 strongly and avoid delaminating and cracking on the chip. We can complete the whole electrical system by leads 450 connecting the chip 300 and the lead frame 600.

The lead-on chip package is a kind of packaged structure in making large-scale chip in the integrated circuit at present. It is applying to produce the random access memory that is over 16 megabyte. The changes of the lead-on chip package are inner structure in the integrated circuit. There are some differences from the lead-on chip package to traditional package in designing the lead frame and the method for bonding the chip. The characteristics and advantages in the lead-on chip package is comprising: (i) The chip is bonded on the lead frame with polyimide and lead frame is designed easier. (ii) The chip circuit-connecting pad in the integrated circuit can be designed in the center of the chip or on the edge of the chip. The elasticity in designing circuit is greater. (iii) The lead-on chip packages can make the angles on the leads connecting not too large to package greater chip. (iv) The lead-on chip packages only change inner structures of packages to use in the small outline packages, thin small outline packages and zis-zag inline packages.

Figure 1:
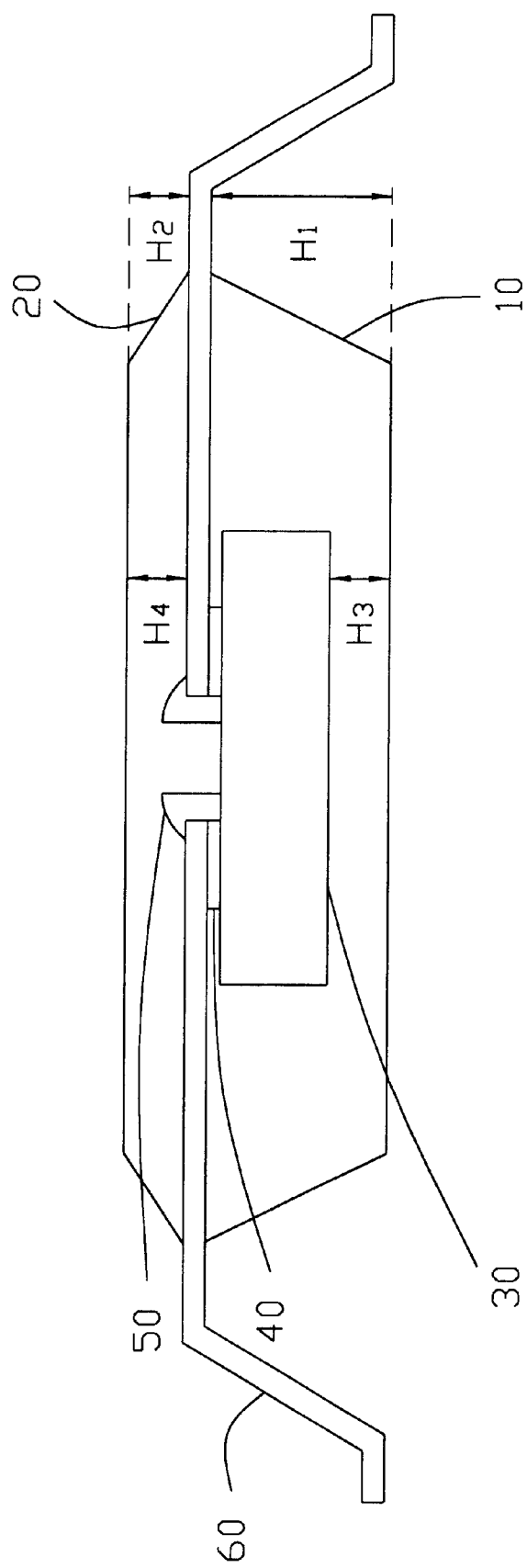
FIG. 1 is a diagram showing the traditional lead-on chip packaged integrated circuits.
Figure 3:
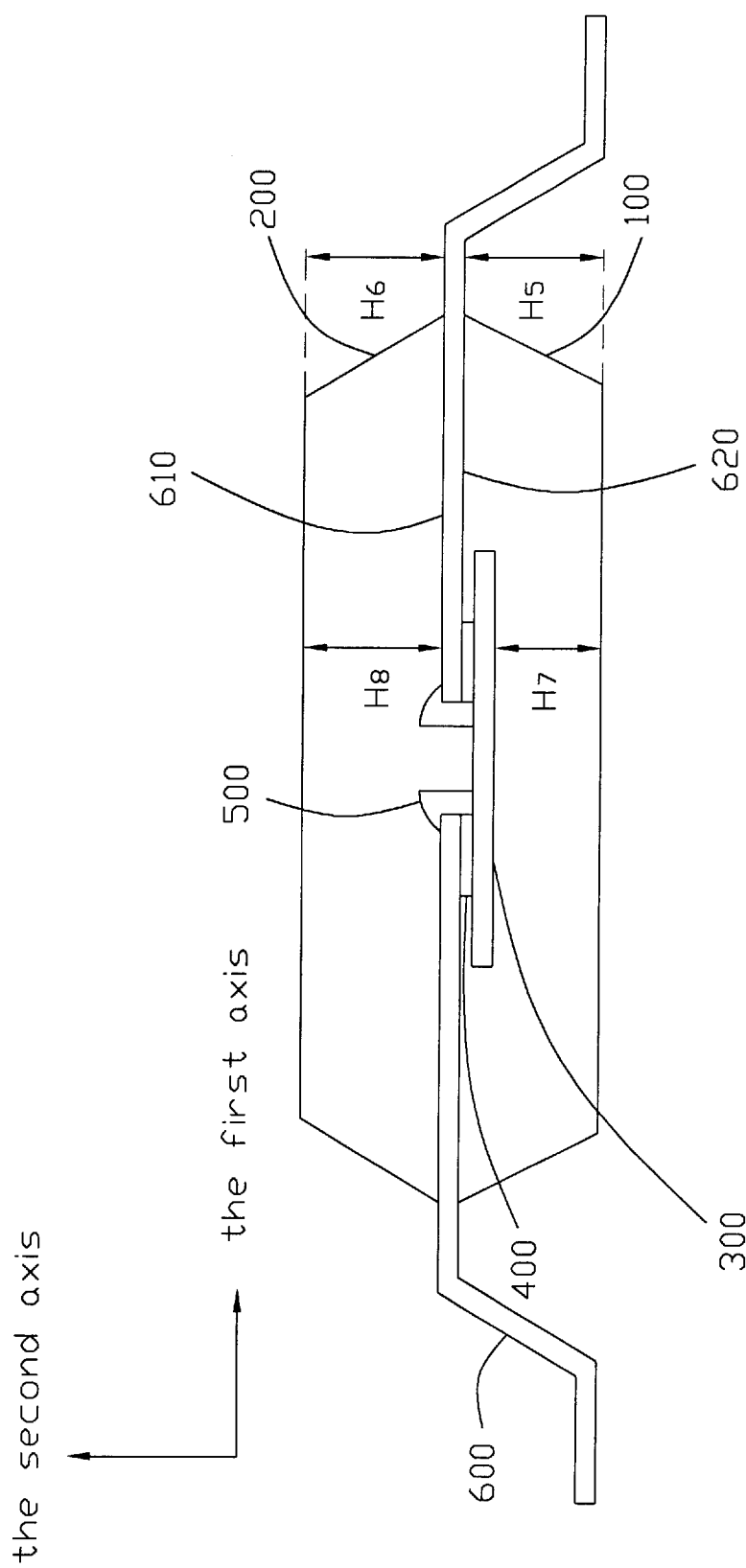
FIG. 3 is a diagram showing the lead-on chip packaged integrated circuits at present.

Referring to FIG. 3, the designing mode of integrated circuit is in the lead-on chip packages. The chip 300 is in the center of the packaged integrated circuit (in opposition to the direction of the first axis). The lead frame 600 is on both side of the chip 300 and is connected to the chip 300 by adhesive layers 400. Center of the chip is leads connecting place 500. In order to raise the density of the integrated circuits on the integrated circuit board and to increase efficacy in the integrated circuits at present, we must make slighter integrated circuits to avoid increasing the volume of the integrated circuits board. Therefore, we usually design the ratio of the thickness of the first mold $H_5$ to the thickness of the second mold $H_6$ to be 1:1 in the producing packaged integrated circuits process. We can also think that we must reduce the thickness of the first mold $H_1$ to reduce the volume of the integrated circuits (referring to FIG. 1).

When we reduce the volume of the integrated circuits in the ratio of the thickness of the first mold $H_5$ to the thickness of the second mold $H_6$ to be 1:1 in the lead-on chip packages as usual, the thickness of the first mold is reduced (the length $H_7$ between the chip 300 and the first mold packaged materials at the second axis is reduced relatively). The length between the lead frame 600 and the second mold packaged material at the second axis $H_6$ is not equal to the length $H_7$ between the chip 300 and the first mold packaged material at the second axis.

Figure 4:
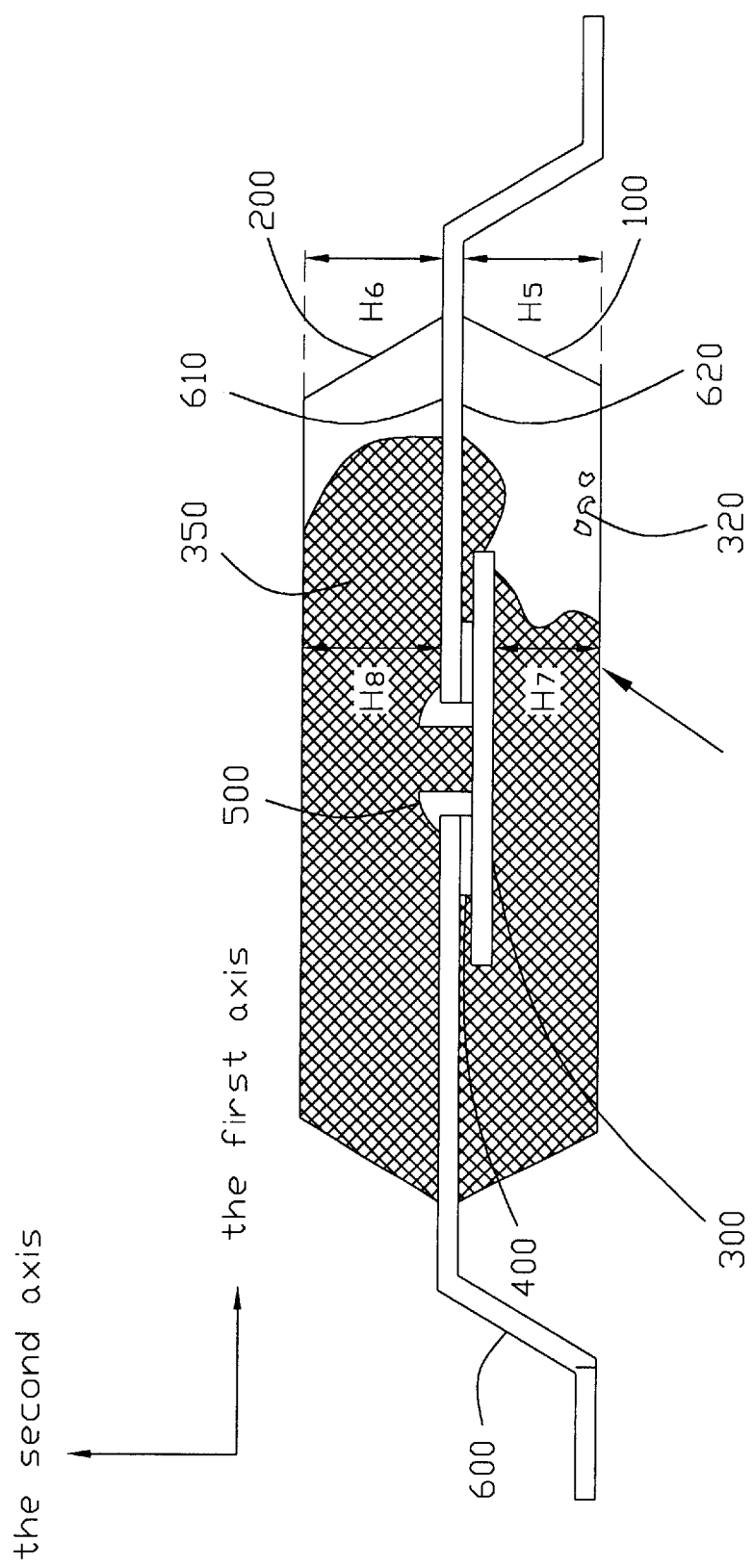
FIG. 4 is a diagram showing the lead-on chip packaged integrated circuits with unbalanceable thermal mold flow to make voids.

Referring to FIG. 4, if the length between the lead frame 600 and the second mold packaged material at the second axis $H_8$ is not equal to the length $H_7$ between the chip 300 and the first mold packaged material at the second axis, the thermal mold flow 350 will be unbalance in the first mold and the second mold to produce the voids 320 in the packages, wherein the chip 300 is connected to the lead frame 600 by adhesive layers 400.

When the packaged integrated circuits have been packaged and electrified, the environment in the packages is high temperature and high humidity. The voids 320, which are produced by unbalanceable thermal mold flow 350, are focus points in high temperature and high humidity to be unable dissipating thermal to others spaces in the packages. The part of the chip 300, which is near voids 320, will occur delaminating and cracking easily and then become bad products to reduce the quality of the integrated circuit process.

The heat sink using in the present invention is the way in the lead-on chip integrated circuit packages. This heat sink can be also used in different structure in chip, different materials, different taps to be the binder and different molding materials. The chip is placed in the center of the integrated circuit (in opposition to the direction of the first axis). The lead frame is placed on both side of the chip. Center of the chip is leads connecting place. The following describing embodiments are some of the applicable ways for using heat sink in the lead-on chip packages.

The heat sink material using in the present invention is a kind of heat conduction object having higher heat conduction coefficient to dissipate the thermal which is from lead frame to others spaces in the packages. In general, the heat conduction coefficient of the materials using in heat sink is about 2 to 400 w/m·° C. at 100° C. If the heat conduction coefficient of the materials using in heat sink is higher, the efficacy of the heat conduction in heat sink is better. The heat sink is about 0.8 to 1.2 times the thickness of said chip.

Figure 5:
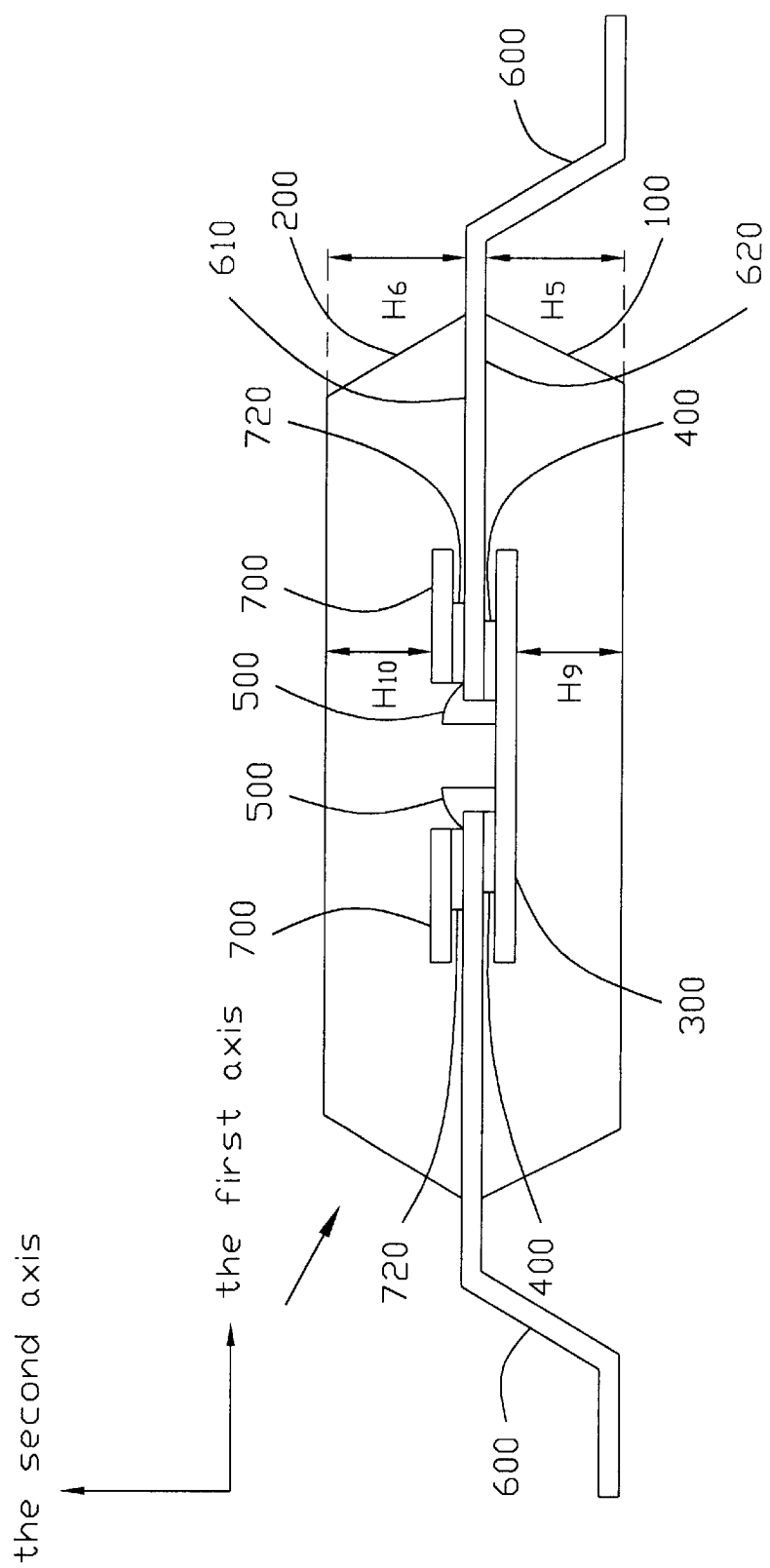
FIG. 5 is a diagram showing the lead-on chip packaged integrated circuits with using the present invention of the heat sink.

Referring to FIG. 5, the heat sink 700 using in the present invention is bonded by a tape 720 on the first surface 610 of the lead frame 600 in the lead-on chip packages, wherein the chip 300 is connected to the lead frame 600 by adhesive layers 400. In this embodiment, the center of the chip 300 is leads connecting place; therefore we need two blocks of heat sinks 700. The placed situation of the heat sink 700 will affect the balance of the thermal mold flow 350 seriously. The length between the heat sink 700 using in the present invention and the packaged materials at the first axis is about 0.8 to 1.2 times the length between the chip and the packaged materials at the first axis. And the length between the heat sink 700 using in the present invention and the packaged materials at the second axis is about 0.8 to 1.2 times the length between the chip and the packaged materials at the second axis. The second axis is vertical to the first axis. When the volume of the packaged integrated circuit be reduced, the ratio of the thickness of the first mold $H_5$ to the thickness of the second mold $H_6$ is 1:1. The heat sink 700 on the first surface 610 of the lead frame 600 reducing the space of the second mold 200. The length between the cheep 300 and the first mold 100 packaged materials $H_9$ is not too longer than the length between the lead frame 600 and the second mold 200 packaged materials $H_{10}$ with reducing the thickness of the first mold $H_5$ to produce the voids from unbalanceable thermal mold flow in the using integrated circuit packages. The heat sink 700 bonding on the first surface of the lead frame 600 make the length between the cheep 300 and the first mold 100 packaged materials $H_9$ at the second axis to be about 0.8 to 1.2 times the length between the lead frame 600 and the second mold 200 packaged materials $H_{10}$ at the second axis. The heat sinks 700 also make the thermal mold flow in the first mold 100 and the second mold 200 to be balanceable in the electrifying integrated circuit to avoid producing voids from unbalanceable thermal mold flow and increase the qualities and using life of the integrated circuits.

Figure 6:
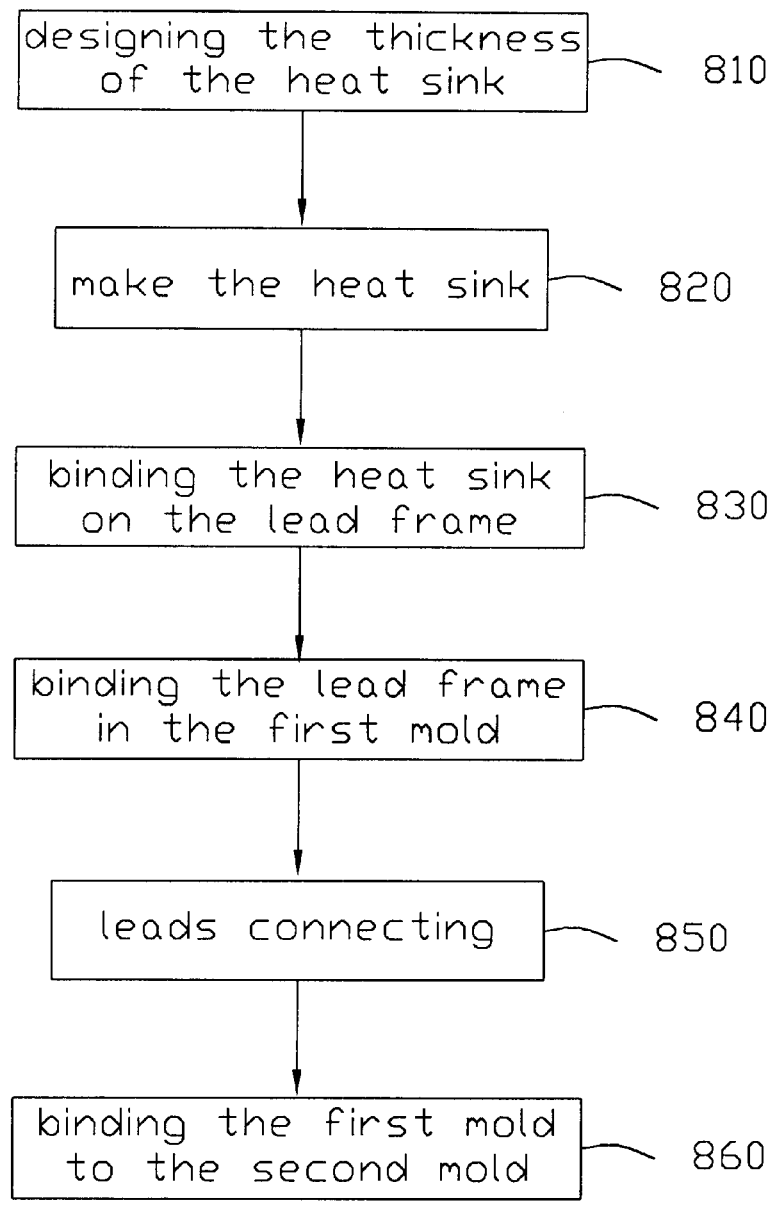
FIG. 6 is a flow diagram showing the lead-on chip packaged integrated circuits at present with using the present invention of the heat sink.

Referring to FIG. 6, it is a flow diagram showing the lead-on chip packaged integrated circuits at present with using the present invention of the heat sink. The first, we must consider the length between the cheep and the first mold packaged materials and the thickness of the chip to decide the thickness of the heat sink 810 and to make the heat sink 820. Next, the heat sink is bonded on the suitable place on the first surface of the lead frame by the tap 830 and the lead frame is bonded in the first mold 840. Then, the chip is bonded on the second surface of the lead frame by an adhesive layer and performing the circuit connecting between the lead and the chip 850. Finally, we bind the first mold to the second mold 860 and perform the process for making the heat sink in the lead-on chip integrated circuit packages.

There is another function for heat sink bonding on the lead frame in thermal dissipating. If the surface of the heat sink is bigger, the efficiency of the thermal dissipating is better on the way for the thermal mold flow. The heat sink bonding on the lead frame will increase the thermal dissipating surface of the lead frame to get the better thermal dissipating efficiency. The heat sink can not make the lead frame too heat to hurt the functions of the integrated circuits.

Figure 7C:
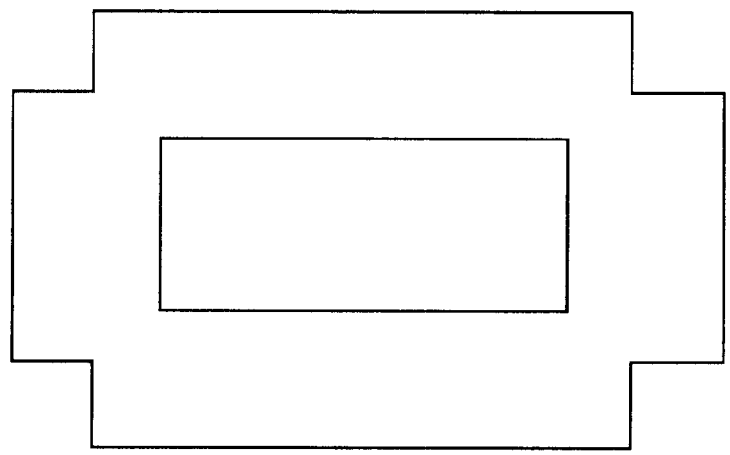
FIGS. 7A to 7C are diagrams showing the shape on the surface of the heat sink.
Figure 7B:
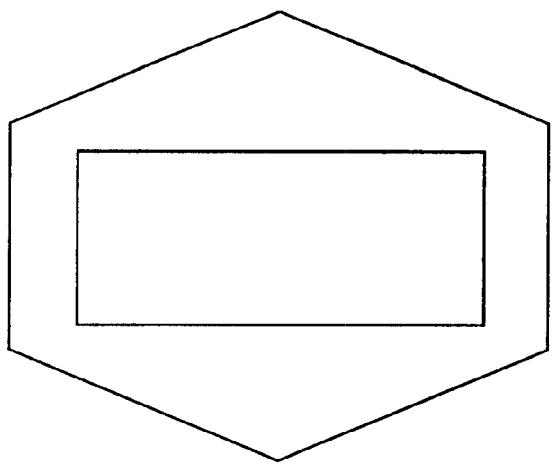
Figure 7A:
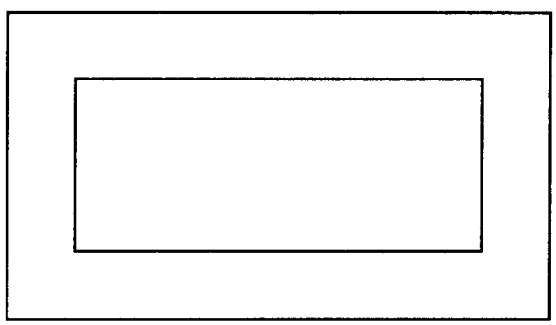
Figure 8:
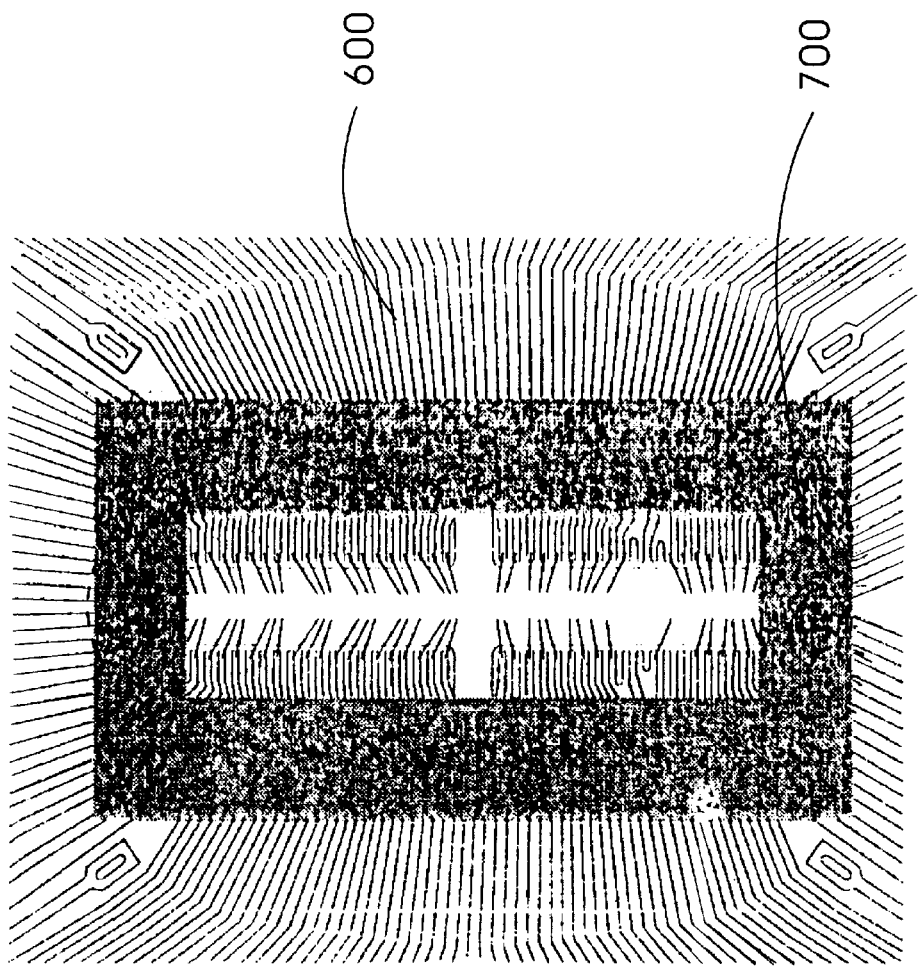
FIG. 8 is a diagram showing the heat sink to be bonded on the lead frame.

Referring to FIGS. 7A to 7C, these are vertical view diagrams into the shape of the heat sink bonding on the first surface of the lead frame at the first axis. To follow the differences in designing, we use different shapes of the heat sink increasing the thermal dissipating efficiency and balancing the thermal mold flow between the first mold and the second mold to avoid producing voids. Referring to FIG. 8, it is a vertical view diagram of the heat sink 700 bonding on the first surface of the lead frame 600 at the first axis.

In accordance with the present invention, a main object of this method is to provide heat sinks, which is bonded on the first surface of the lead frame at the second axis to prevent producing the voids. It is another object of this invention to increase the thermal dissipating velocity on the surface of the lead frames to prevent the lead frames over heat. It is further object of this invention is increasing the life of the integrated circuits and reducing the bad rate of the quality in the integrated circuits.

Although specific embodiments have been illustrated and described, it will be obvious to those skilled in the art that various modifications may be made without departing from what is intended to be limited solely by the appended claims.

What is claimed is:

1. An integrated circuit package, said integrated circuit package comprising:
   a chip dealing with a data in an integrated circuit;
   a lead frame having said chip bonding on a first surface of said lead frame by an adhesive layer and making said chip electrifying;

a heat sink bonding on a second surface of said lead frame by a tap without conducting electricity;

a first mold surrounding and protecting said lead frame and said heat sink in said integrated circuit; and a second mold bonding with said first mold to surround and to protect said chip in said integrated circuit, wherein a length between said chip and said second mold at a first axis to be about 0.8~1.2 times the length between said heat sink and said first mold at said first axis.

2. The integrated circuit package according to claim 1, wherein said adhesive layer comprises a chip protecting layer.

3. The integrated circuit package according to claim 1, wherein said heat sink thermal conductivity is 2 to 400 w/in·° C. at 100° C.

4. The integrated circuit package according to claim 3, wherein a length between said heat sink and said the first mold packaged materials at a second axis is about 0.8~1.2 times the length between said chip and said second mold packaged materials at said second axis.

5. The integrated circuit package according to claim 4, wherein said second axis is vertical to said first axis.

6. The integrated circuit package according to claim 3, wherein said heat sink comprises two pieces of heat sink.

7. The integrated circuit package according to claim 3, wherein said heat sink is about 0.8 to 1.2 times the thickness of said chip.

8. The integrated circuit package according to claim 1, wherein said tap without conducting electricity comprises a thermal fusion binder.

* * * * *